US006391812B1

(12) United States Patent
Araki et al.

(10) Patent No.: US 6,391,812 B1
(45) Date of Patent: May 21, 2002

(54) SILICON NITRIDE SINTERED BODY AND METHOD OF PRODUCING THE SAME

(75) Inventors: Kiyoshi Araki, Nagoya; Katsuhiro Inoue, Ama-gun, both of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/579,970

(22) Filed: May 26, 2000

(30) Foreign Application Priority Data

Jun. 23, 1999 (JP) ............................................ 11-176478

(51) Int. Cl.⁷ ............................................ C04B 35/587
(52) U.S. Cl. .................. 501/97.3; 264/666; 264/683
(58) Field of Search ......................... 501/97.3; 264/666, 264/683

(56) References Cited

U.S. PATENT DOCUMENTS

| 5,238,884 | A | * | 8/1993 | Sakai et al. ................. 501/97.3 |
| 5,382,273 | A | * | 1/1995 | Mehrotra et al. .......... 501/97.3 |
| 5,525,134 | A | * | 6/1996 | Mehrotra et al. .......... 501/97.3 |
| 5,698,896 | A | * | 12/1997 | Komatsu et al. ........... 501/97.3 |
| 5,922,629 | A | * | 7/1999 | Park et al. .................. 501/97.3 |
| 6,242,374 | B1 | * | 6/2001 | Komatsu .................... 501/97.3 |

FOREIGN PATENT DOCUMENTS

| DE | 2 412 339 | 9/1974 |
| EP | 0 438 897 A1 | 7/1991 |
| JP | 3-218975 | 9/1991 |
| JP | 9-30866 | 2/1997 |

OTHER PUBLICATIONS

Database Chemabs Online! Chemical Abstracts Service, Columbus, Ohio, US; May 13, 1968 T.V. Andreeva et al.: retrieved from STN, Database Accession No. 68:90752 XP002146156 *abstract* & Teplofiz. VYX. Temp., vol. 5, No. 4, 1967, pp. 612–615.
Database WPI Week 197919, Derwent Publications Ltd., London, GB; XP002146157 & SU 612 913 A (AS Ukr. Mater. Scie.) Jun. 22, 1978.
Database WPI Week 199715, Derwent Publications Ltd., London, GB; AN 1997–161321 XP002146158 & JP 09–030866 A (Nisson Motor Co. Ltd.), Feb. 4, 1997 *abstract*.

* cited by examiner

Primary Examiner—Karl Group
(74) Attorney, Agent, or Firm—Burr & Brown

(57) ABSTRACT

A method of producing the silicon nitride sintered body includes the steps of forming a compact of molding materials including silicon nitride powder, a Mg component and a sintering aid, and sintering the molding materials at 1,800 to 2,000° C. under a nitrogen atmosphere. The materials at least include an oxide of Mg in a range of 0.3 to 10 wt. %. A constant temperature is kept for at least 0.5 hours in a temperature range of 1,400 to 1,700° C. before the temperature is increased to the sintering temperature. A silicon nitride body having high thermal conductivity and excellent electrical insulation properties at high temperature can thus be provided.

7 Claims, 3 Drawing Sheets

SILICON NITRIDE SINTERED BODY AND METHOD OF PRODUCING THE SAME

BACKGROUND OF THE INVENTION

1. Field of the Invention

The present invention relates to a silicon nitride sintered body having high thermal conductivity as well as excellent electric insulation properties under high temperature, and the method of producing the same.

2. Description of Related Art

Silicon nitride sintered bodies possess excellent mechanical characteristics such as strength and toughness, and other various excellent characteristics including abrasion resistance, oxidation resistance, electric insulation properties and so forth, so that they have been generally used as a structural material for heat engines such as diesels and gas turbines. However, they have not been used for members having radiation properties (for instance, circuit substrates) since their thermal conductivity characteristics are inferior to those of sintered bodies of BeO, AlN, SiC and so forth.

However, the present applicant has tried various modifications under the consideration that silicon nitride sintered bodies may be preferably used for circuit substrates and so forth if their thermal conductivity characteristics can improve, while making use of their excellent mechanical characteristics and electric insulation properties.

As in, for example, Japanese Patent Application Publication No. 3-218975, it has already been disclosed that silicon nitride sintered bodies having both excellent mechanical characteristics and preferable thermal conductivity characteristics may be obtained by controlling the size of crystal grains of a polycrystalline substance of silicon nitride as well as the content of Al as an impurity.

Additionally, as in Japanese Patent Application Publication No. 9-30866, it has recently been disclosed that silicon nitride sintered bodies having preferable mechanical characteristics and high thermal conductivity may be obtained by forming the crystal grains of a polycrystalline substance of silicon nitride as a composite of rough grains and fine grains and by regulating the ratio of rough grains. The above-mentioned silicon nitride sintered bodies having excellent thermal conductivity may be preferably used as the circuit substrates that are required to radiate heat smoothly from an element and to completely insulate both sides of a substrate and inter-wires on and in the substrate. Examinations have been carried out on, e.g., semiconductor modules and the like wherein a metal circuit is provided with the silicon nitride sintered body as a substrate and a semiconductor element is further placed thereon.

However, although the above-mentioned silicon nitride sintered bodies show sufficient electrical insulation properties under room temperature, their electrical insulation properties often decline sharply under high temperature, so that the bodies have been insufficient as, e.g., on-vehicle circuit substrates that need electric insulation properties under high temperature of 100° C. or higher. Particularly, when they are used as a circuit substrate for a semiconductor device, such as a thyristor, which controls a large current, they must have higher electrical insulation properties than average circuit substrates, so that the above-described problem becomes very apparent.

Specifically, a silicon nitride sintered body has not yet been found that has preferable characteristics as a circuit substrate used under high temperature. Thus, a silicon nitride sintered body has been in demand that satisfies both thermal conductivity characteristics and electrical insulation properties under high temperature.

SUMMARY OF THE INVENTION

It is an object of the present invention to provide a silicon nitride sintered body having high thermal conductivity and excellent electrical insulation properties under high temperature, and a method of producing the same.

Specifically, according to the present invention, a silicon nitride sintered body is provided which includes silicon nitride crystalline grains and a grain boundary phase and contains Mg at 0.3 to 10 wt. % in terms of oxide. The sintered body has a thermal conductivity of 60 W/mK or higher and has an electric resistivity of 1E+13 Ωcm or above at 125° C.

The silicon nitride sintered body of the present invention preferably has an electrical resistivity of 1E+11 Ωcm or above at 400° C., and the percentage content of a simple substance of Al is preferably 0.25 wt. % or less. Moreover, according to the present invention, a circuit substrate is provided that includes the silicon nitride sintered body mentioned above.

Furthermore, according to the present invention, a method of producing a silicon nitride sintered body is provided that includes the steps of compacting molding materials including silicon nitride powder, a Mg compound and a sintering aid, and sintering the compact under a nitrogen atmosphere at 1,800 to 2,000° C. After preparing the molding materials to contain Mg at 0.3 to 10 wt. % in terms of oxide and keeping a constant temperature for 0.5 hours or longer in the temperature range of 1,400 to 1,700° C., the temperature is raised to the sintering temperature.

DESCRIPTION OF THE PREFERRED EMBODIMENT

Figure 1:
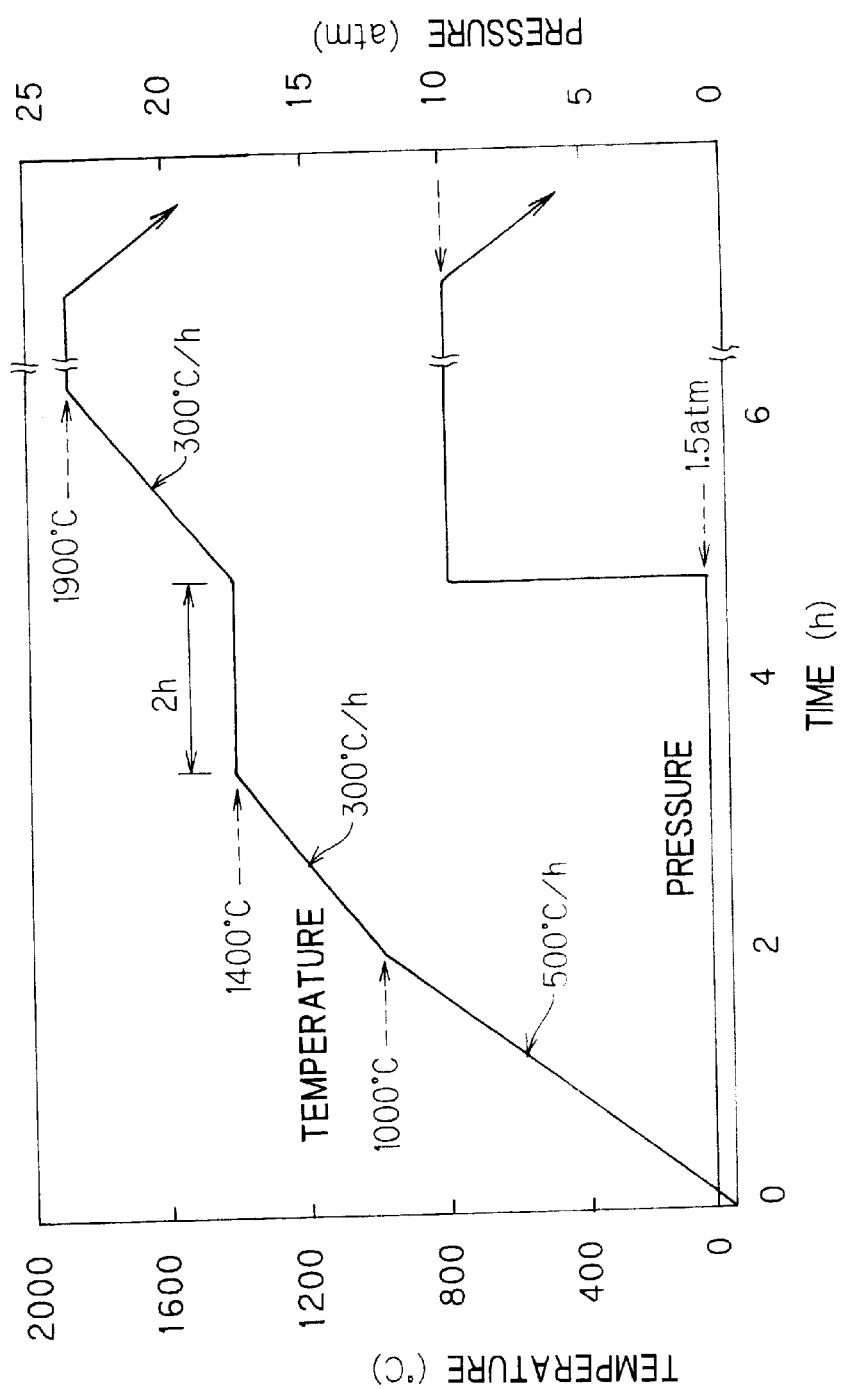
FIG. 1 is a graph showing a sintering schedule according to Example 1-1.

The present invention is a silicon nitride sintered body, which contains Mg at 0.3 to 10 wt. % in terms of oxide and has a thermal conductivity of 60 W/mK or higher and an electrical resistivity of 1E+13 Ωcm or more at 125° C. Such a silicon nitride sintered body has high thermal conductivity and excellent electric insulation properties at high temperature, so that it may be preferably used as, e.g., an on-vehicle circuit substrate, particularly, as a circuit substrate for a semiconductor element for overcurrent control such as a thyristor.

The silicon nitride sintered body of the present invention will be explained below in detail. The silicon nitride sintered body of the present invention has a grain boundary phase consisting of oxide, oxynitride and so forth between silicon nitride crystalline grains having a grain size of about 0.1 to 100 μm. Normally, the relative density is about 97 to 100%, and the number of grain boundaries per 10 μm is about 5 to 30.

The silicon nitride sintered body of the present invention contains Mg of 0.3 to 10 wt. % in terms of oxide. The sintered body containing Mg of at least 0.3 wt. % has high electrical resistivity at high temperature and the necessary electrical insulation properties as a circuit substrate. However, when the sintered body contains too much Mg, the body will not be sintered enough and its thermal conductivity will not increase. Thus, it is necessary that the percentage content is 10 wt. % at most or less.

Moreover, the silicon nitride sintered body of the present invention has a thermal conductivity of 60 W/mK or more. If the thermal conductivity is less than 60 W/mK, sufficient radiation properties as a circuit substrate would not be obtained and the application thereof would be limited. Furthermore, the silicon nitride sintered body of the present invention has an electrical resistivity of 1E+13 Ωcm or more at 125° C. In order to maintain electrical insulation properties in an ordinary circuit substrate or the like, the electrical resistivity of about 1E+11 Ωcm is sufficient. However, when the sintered body is used as a circuit substrate for a semiconductor device, such as a thyristor, which controls a large current, such sintered bodies must have higher electrical insulation properties.

Additionally, the temperature for measuring electrical resistivity is 125° C. because on-vehicle circuit substrates are used under high temperature of about 100 to 150° C. The silicon nitride sintered body of the present invention must have an electrical resistivity of at least 1E+13 Ωcm or more at 125° C., but it is preferable that the electric resistivity is 1E+11 Ωcm or higher at 400° C.

Although insulation is not broken under a high temperature of about 400° C., current may leak due to the decrease of resistivity. Even in such a case, electrical resistivity of 1E+11 Ωcm or higher makes it possible to suppress the current leak between heater terminals of a high-temperature heater, a glow plug and the like, or between a heater and a heated object. In other words, a high-temperature heater, a glow plug and the like may be preferably used at a higher temperature.

It is preferable that the silicon nitride sintered body of the present invention contains elemental Al as an impurity at 0.25 wt. % or less in percentage content. As the percentage content of Al exceeds 0.25 wt. %, the Al is solid-dissolved in silicon nitride grains, thus decreasing thermal conductivity of the sintered body.

The above-mentioned silicon nitride sintered body of the present invention has high thermal conductivity and excellent electrical insulation properties at high temperature, so that it may be preferably used as, e.g., an on-vehicle circuit substrate under high temperature. Particularly, when a circuit substrate used as a circuit substrate for a semiconductor device, such as a thyristor, which controls a large current, they must have higher electrical insulation properties.

Moreover, the silicon nitride sintered body of the present invention may be preferably used not only as a circuit substrate but also as a material for a high-temperature heater such as a heater used for a semiconductor manufacturing device or a glow plug and the like. This is because the sintered body may be used at high temperature since electrical insulation properties between terminals at high temperature can be improved, and because it also has excellent soaking properties due to high thermal conductivity. The silicon nitride sintered body also has excellent corrosion resistance, so that it may be preferably used particularly as a material for a heater used for a semiconductor manufacturing device, such as a CVD, that is used under a corrosive atmosphere.

The silicon nitride sintered body of the present invention cannot be obtained using only conventional production methods, wherein molding materials including silicon nitride powder, a sintering aid such as $Y_2O_3$ and others are compacted and the compact is then sintered under a nitrogen atmosphere or an inactive gas atmosphere. However, the sintered body of the present invention may be produced by adding a Mg compound in a predetermined amount to the molding materials and by introducing the step of holding a constant temperature for a predetermined period in the temperature rising process before sintering.

The production method of the present invention will be explained below in detail. In the production method of the present invention, a compact is first produced by compacting molding materials. The molding materials used in the present invention include at least silicon nitride powder, a Mg compound and a sintering aid. Since silicon nitride is a ceramic having low sintering properties, it is preferable to use fine particles having a grain size of 2 μm or less for the silicon nitride powder in the molding materials. As the grain size is reduced, the surface tension increases and sintering becomes easier.

Silicon nitride has an α phase and a β phase as a crystal structure. However, the β-ratio of the silicon nitride powder is not particularly limited, and a powder having a low β-ratio of around 1% may also be used for the molding materials. This is because in the production method of the present invention, sintering is carried out at a high temperature of 1,800° C. or higher, so that the α phase is irreversibly converted to the β phase. There is also no particular limitation on the content of oxygen as an impurity in the silicon nitride powder, but the content is normally around 0.5 to 2.0%.

Additionally, it is necessary that the molding materials of the present invention include a Mg compound so as to contain Mg of 0.3 to 10 wt. % in terms of oxide. As described, by adding Mg in this range, the electrical resistivity of the sintered body may improve and the sintered body may also become much more compact. The kinds of Mg compounds are not particularly limited, and it is possible to apply MgO, which is also used as a sintering aid as described below.

Furthermore, it is necessary that the molding materials of the present invention contain a sintering aid to facilitate the sintering of silicon nitride as a ceramic having low sintering properties. The kinds of sintering aids are not particularly limited and, for instance, oxides such as MgO, $ZrO_2$ and the like may be used. MgO is highly effective in increasing the density of silicon nitride and also in improving the electric resistivity of the sintered body. $ZrO_2$ is preferable since it can improve the mechanical strength of the sintered body.

It is also preferable to use rare earth oxides such as $Y_2O_3$, $Yb_2O_3$ and $Nd_2O_3$ in addition to the sintering aid mentioned above. The rare earth oxide is evenly distributed on the surface of silicon nitride particles and is bonded to an impurity, $SiO_2$, and a sintering aid, MgO, and others, thus forming a liquid phase or crystals having a high melting point. Thus, rare earth oxides are effective in increasing the density and strength of the sintered body.

The percentage content of the sintering aid in the molding materials as a whole is not particularly limited, but is preferably 1 to 10 wt. % in terms of oxide. While sintering does not progress with too little sintering aid, a large amount of glass phases are formed between silicon nitride particles with too much sintering aid, thereby lowering the thermal conductivity of the sintering body.

Furthermore, as long as the molding materials of the present invention include silicon nitride powder, a Mg compound and a sintering aid, other materials may be added.

For example, in order to add light shielding properties to the sintered body, $Mo_2C$ or SiC may be added. These materials are preferable in preventing the malfunctions of a semiconductor device caused by electromagnetic waves having a wavelength near visible light when the sintered body is used as a circuit substrate.

A compact may be formed from the above-noted molding materials by a conventional molding method. For instance, a method including the steps of forming a slurry by adding water to the above-mentioned molding materials and then mixing and grinding it in a mixing vessel type agitating mill such as an "Attoritor (trade name)" manufactured by Mitsui Miike Machinery Co., Ltd., then drying and granulating the material with a spray drier after a binder is added, and injecting the granules into a mold and then pressing and molding with hydrostatic pressure, or other methods can be used. This molding method is preferable because it can prevent aggregation of powders, can disperse the sintering aids evenly and can add fluidity to the materials.

Moreover, the binder can decrease frictional resistance between primary particles and facilitate the grinding of granular powder, so that the binder can preferably reduce the size of defects. The kinds of binder are not particularly limited, but include organic materials such as polyvinyl alcohol, polyethylene glycol, and so forth.

The above-mentioned compact prevents the decomposition and oxidation of silicon nitride, so that the compact is sintered under a nitrogen atmosphere and then becomes a sintered body, and sintering may be carried out under the pressurizing condition of nitrogen gas of 1 to 20 atmospheric pressures. The sintering temperature needs to be 1,800° C. or higher so as to provide a high density sintered body, but should be 2,000° C. or lower to prevent the decomposition of silicon nitride.

Additionally, in the production method of the present invention, after a constant temperature in the temperature range of 1,400 to 1,700° C. (for example, 1,500° C.) is held for 0.5 hours or longer, the temperature is increased to the sintering temperature mentioned above.

According to this method, the electrical resistivity of the sintered body can improve.

The reasons for the increased electrical resistivity of the sintered body in the method of the present invention are unclear. However, it is assumed that a small amount of MgO in the molding materials is solid-dissolved in silicon nitride crystalline grains or MgO is dissolved to evenly enclose silicon nitride crystalline grains by sintering at a constant temperature in the initial stage of sintering, thus improving the electric resistivity of the sintered body.

Specifically, a temperature below 1,400° C. is not high enough. When the temperature is higher than 1,700° C., the sintering speed at the initial stage of sintering is too high, so that MgO will not be solid-dissolved or dissolved well. Moreover, since it takes some time to solid-dissolve or dissolve MgO, the above-noted temperature should be held for 0.5 hours or longer.

Additionally, for the "constant temperature" mentioned in the method of the present invention, it is acceptable if the temperature is within the temperature range of 1,400 to 1,700° C. and is maintained at a setting temperature of about ±20° C.

As explained above, according to the production method of the present invention, a silicon nitride sintered body is easily produced that can be preferably used as a circuit substrate for, e.g., an on-vehicle semiconductor. Particularly, when they are used as a circuit substrate for a semiconductor device, such as a thyristor, which controls a large current, the silicon nitride sintered body must have high thermal conductivity and excellent electrical insulation properties at high temperature.

The present invention will be explained in further detail, with the reference to the examples. However, the present invention is not limited to these examples.

Additionally, silicon nitride powders, sintering aids and light shielding agents used in the following examples and comparative examples are ones which contain elemental Al at 0.01 wt. % or less as an impurity.

Method of Evaluating the Sintered Body

Silicon nitride sintered bodies were evaluated by measuring relative density, thermal conductivity, electrical resistivity, number of grain boundaries, β-ratio, room temperature strength and fracture toughness in the following evaluation methods.

(1) Relative Density: The density was measured by Archimedes' principle in a water solvent. The theoretical density with the composition of each aid was calculated from the weighted average of the blending weight of a density of silicon nitride as well as a single aid.

(2) Thermal Conductivity: The sintered body was prepared in a cylindrical shape of 10 mm in diameter×3 mm in thickness as a sample. The conductivity was measured by the laser flash method, in accordance with the method described in JIS R1611.

(3) Electrical Resistivity: The sintered body sample was prepared in a plate form 50 mm long ×50 mm wide×1 mm thick and Ag paste, as terminals, was coated and then baked thereon. The resistivity was measured with the field intensity of 500 V/mm by the three-terminal method in a vacuum, in accordance with method described in JIS C2-141.

(4) Number of Grain Boundaries: A fine structure at an appropriate cross section of the sintered body was photographed under the magnification where an individual silicon nitride particle could be identified, by a scanning electron microscope. Then, a straight line was drawn on a photograph, and the number of grain boundaries across the straight line was counted. Straight lines were drawn by changing visual fields until the number of grain boundaries exceeded 1,000. The number per 10 μm was calculated, in accordance with (1000/L×10), from the total length (L μm) required to count 1,000 grain boundaries. For instance, if 500 μm is required to count 1,000 grain boundaries, the number of grain boundaries per 10 μm would be twenty.

(5) β-ratio: The ratio was calculated from the X-ray diffraction Intensity α(210) and α(201) of $Si_3N_4$ and β(101) and β(210) of β-$Si_3N_4$, in accordance with the following formula. (Formula 1)

$$\beta-\text{ratio }(\%) = \frac{\beta(101) + \beta(210)}{\alpha(210) + \alpha(201) + \beta(101) + \beta(210)} \times 100$$

(6) Room Temperature Strength: The sintered body sample was prepared in a rod form of 4 mm in length×3 mm in width×40 mm in height, and the four-point bending strength was measured in accordance with the method described in JIS R1601.

(7) Fracture Toughness: This was measured by the SEPB method, in accordance with the method described in JIS R1607.

EXAMPLE 1

In Example 1, an appropriate temperature during the process of holding a constant temperature was tested.

$ZrO_2$, as a sintering aid, and $Mo_2C$, as an agent for adding light shielding properties, were further added to the molding materials including the commercial silicon nitride powder, which has the β-ratio and the quantity of oxygen as an impurity shown in Table 1 and has 11 m²/g in specific surface area, and MgO and $Y_2O_3$ sintering aids, and were mixed in the ratios shown in Table 1. Additionally, in Table 1, the percentage content of the molding materials are noted for MgO and $Y_2O_3$, and percentage additions in relation to the molding materials are noted for $ZrO_2$ and $Mo_2C$.

A slurry was formed by adding water to the abovementioned molding materials and then mixing and grinding it in a mixing vessel type agitating mill such as an "Attoritor (trade name)" manufactured by Mitsui Miike Machinery Co., Ltd. The slurry was dried and granulated by a spray drier after PVA (polyvinyl alcohol) and PEG (polyethylene glycol) were added as binders. Furthermore, the granules were injected into a mold and were then pressed and molded with hydrostatic pressure at 690 Mpa, thus preparing a compact of 60×60×6 mm.

After the binders were removed, the compact was sintered in a $N_2$ atmosphere, in accordance with the temperature rising schedule of Example 1-1 shown in FIG. 1, thus providing the sintered bodies of Examples 1-1 to 1-3 and Comparative Examples 1-1 and 1-2.

The composition of the materials and the production conditions, and the characteristics of the sintered bodies are shown in Table 1 and Table 2, respectively.

TABLE 1

| | Material Composition | | | | | | Production Condition | | | | | |
| | Silicon Nitride starting powders | | Sintering Aid | | | | | Conditions of Holding Constant Temperature | | | Sintering Conditions | |
| Unit | β-ratio % | Oxygen Qt. as Impurity % | MgO wt % (% content) | $Y_2O_3$ | Others | $ZrO_2$ wt % (% addition) | Light Shielding Agent (% addition) | Holding Temperature °C. | Holding Period Hrs | Gas Pressure During Holding Process atm | Sintering Temperature °C. | Sintering Time Hrs | Gas Pressure During Sintering Process atm |
|---|---|---|---|---|---|---|---|---|---|---|---|---|---|
| Comp. Ex. 1-1 | 3 | 1.3 | 2 | 3 | — | 0.3 | 0.1 | 1300 | 4 | 1.5 | 1900 | 20 | 10 |
| Ex. 1-1 | 3 | 1.3 | 2 | 3 | — | 0.3 | 0.1 | 1400 | 2 | 1.5 | 1900 | 20 | 10 |
| Ex. 1-2 | 3 | 1.3 | 2 | 3 | — | 0.3 | 0.1 | 1550 | 1.5 | 1.5 | 1900 | 20 | 10 |
| Ex. 1-3 | 3 | 1.3 | 2 | 3 | — | 0.3 | 0.1 | 1650 | 1 | 1.5 | 1900 | 20 | 10 |
| Comp. Ex. 1-2 | 3 | 1.3 | 2 | 3 | — | 0.3 | 0.1 | 1750 | 1 | 1.5 | 1900 | 20 | 10 |
| Comp. Ex. 2-1 | 3 | 1.3 | 1 | 1.5 | — | 0.15 | 0.1 | 1550 | 1 | 1.5 | 1700 | 20 | 10 |
| Ex. 2-1 | 3 | 1.3 | 1 | 1.5 | — | 0.15 | 0.1 | 1550 | 1 | 1.5 | 1800 | 20 | 10 |
| Ex. 2-2 | 3 | 1.3 | 1 | 1.5 | — | 0.15 | 0.1 | 1550 | 1 | 1.5 | 1900 | 6 | 10 |
| Ex. 2-3 | 3 | 1.3 | 1 | 1.5 | — | 0.15 | 0.1 | 1550 | 1 | 1.5 | 2000 | 2 | 10 |
| Comp. Ex. 2-2 | 3 | 1.3 | 1 | 1.5 | — | 0.15 | 0.1 | 1550 | 1 | 1.5 | 2100 | 2 | 300 |

TABLE 2

| | Characteristics of Sintered Body | | | | | | | | |
| | Thermal | Electric Resistivity | | Relative | Number of Grain | Silicon Nitride | | Room Temp. | Fracture |
| Unit | Conductivity W/mK | 125° C. Ω cm | 400° C. Ω cm | Density % | Boundaries per 10 μm | β-ratio % | Al Qt. % | Strength MPa | Toughness MPam$^{1/2}$ |
|---|---|---|---|---|---|---|---|---|---|
| Comp. Ex. 1-1 | 76.2 | 4.2E+12 | 8.2E+10 | >99 | 14 | 100 | <0.1 | 900 | 7.2 |
| Ex. 1-1 | 84.3 | 1.5E+13 | 3.1E+12 | >99 | 11 | 100 | <0.1 | 910 | 7.7 |
| Ex. 1-2 | 86.4 | 1.1E+14 | 5.8E+12 | >99 | 11 | 100 | <0.1 | 860 | 7.6 |
| Ex. 1-3 | 83.2 | 5.3E+13 | 6.8E+12 | >99 | 10 | 100 | <0.1 | 820 | 7.1 |
| Comp. Ex. 1-2 | 57.6 | 3.1E+13 | 5.1E+12 | 95 | 19 | 100 | <0.1 | 620 | 5.8 |
| Comp. Ex. 2-1 | 42.1 | 6.4E+13 | 2.9E+12 | 90 | 29 | 95 | <0.1 | 410 | 4.8 |
| Ex. 2-1 | 62.8 | 4.6E+13 | 1.9E+12 | 98 | 18 | 100 | <0.1 | 710 | 7.7 |
| Ex. 2-2 | 105.1 | 3.9E+13 | 9.9E+11 | >99 | 9 | 100 | <0.1 | 720 | 7.6 |
| Ex. 2-3 | 121.3 | 1.3E+13 | 2.4E+11 | >99 | 5 | 100 | <0.1 | 660 | 7.9 |
| Comp. Ex. 2-2 | 116.1 | 9.6E+11 | 1.8E+10 | >99 | 6 | 100 | <0.1 | 590 | 5.8 |

Results

As shown in Examples 1-1 to 1-3, the sintered bodies having preferable thermal conductivity and electrical resistivity were obtained as long as the constant holding temperature was kept within the range of the present invention. On the contrary, as shown in Comparative Example 1-1, when the holding temperature was below 1,400° C., the electrical resistivity was low at 125° C. as well as at 400° C. As shown in Comparative Example 1-2, when the holding temperature was above 1,700° C, sintering did not progress, and the thermal conductivity was low because of 95% relative density of the sintered body, which is low.

EXAMPLE 2

In Example 2, the sintering temperature after the process of holding a constant temperature was tested. The sintered bodies were produced as in Example 1 under the conditions mentioned in Table 1, thus obtaining the sintered bodies of Examples 2-1 to 2-3 and Comparative Examples 2-1 and 2-2. The composition of the materials and the production conditions, and the characteristics of the sintered bodies are shown in Table 1 and Table 2, respectively.

Results

As shown in Examples 2-1 to 2-3, the sintered bodies having preferable thermal conductivity and electrical resistivity were obtained where the constant holding temperature was properly carried out and the sintering temperature was within the range of the present invention. On the contrary, even though the constant holding temperature was properly carried out, the thermal conductivity of the sintered bodies was low when the sintering temperature was below 1,800° C. as shown in Comparative Example 2-1. As shown in Comparative Example 2-2, when the sintering temperature was above 2,000° C., the electric resistivity was low.

EXAMPLE 3

In Example 3, the effects of adding Mg compounds were tested. The sintered bodies were produced as in Example 1 under the conditions mentioned in Table 3, thus obtaining the sintered bodies of Examples 3-1 to 3-3 and Comparative Examples 3-1 and 3-2. The composition of the materials and the production conditions, and the characteristics of the sintered bodies are shown in Table 3 and Table 4, respectively.

Moreover, $Yb_2O_3$, in addition to $Y_2O_3$, was used as a rare earth oxide in Comparative Example 3-1. SiC and $Mo_2C$ were also added as light shielding agents at 1 wt. % and 2 wt. %, respectively, relative to the molding materials.

TABLE 3

| | Material Composition | | | | | | Production Condition | | | | | |
|---|---|---|---|---|---|---|---|---|---|---|---|---|
| | Silicon Nitride starting powders | | Sintering Aid | | | | | Conditions of Holding Constant Temperature | | | Sintering Conditions | | |
| | β-ratio | Oxygen Qt. as Impurity | MgO | Rare Earth Oxide | | | Light Shielding | Holding Temperature | Holding Period | Gas Pressure During Holding Process | Sintering Temperature | Sintering Time | Gas Pressure During Sintering Process |
| | | | | $Y_2O_3$ | Others (% content) | $ZrO_2$ | Agent (% addition) | | | | | | |
| Unit | % | % | wt % | | | wt % | | ° C. | Hrs | atm | ° C. | Hrs | atm |
| Comp. Ex. 3-1 | 3 | 1.3 | — | 2 | 9.5 | — | 1:2 | 1600 | 1 | 1.5 | 1900 | 4 | 10 |
| Comp. Ex. 3-2 | 3 | 1.3 | — | 6 | — | — | — | 1500 | 4 | 1.5 | 1900 | 20 | 10 |
| Ex. 3-1 | 3 | 1.3 | 1.5 | — | — | — | — | 1500 | 4 | 1.5 | 1950 | 10 | 10 |
| Ex. 3-2 | 3 | 1.3 | 5 | — | — | — | — | 1500 | 4 | 1.5 | 1950 | 4 | 10 |
| Ex. 3-3 | 3 | 1.3 | 7.5 | — | — | — | — | 1500 | 4 | 1.5 | 1950 | 4 | 10 |
| Ex. 4-1 | 3 | 1.3 | 3 | 6 | — | — | — | 1650 | 1 | 1.5 | 1900 | 4 | 10 |
| Ex. 4-2 | 3 | 1.3 | 1.5 | 3 | 3 | — | — | 1480 | 1 | 1.5 | 1900 | 20 | 10 |
| Ex. 4-3 | 3 | 1.3 | 2 | 1.5 | 1.5 | — | — | 1480 | 1 | 1.5 | 1950 | 4 | 10 |
| Comp. Ex. 4-1 | 3 | 1.3 | 1 | 1.5 | 2.5 | — | — | — | — | — | 1900 | 4 | 10 |
| Comp. Ex. 4-2 | 3 | 1.3 | 1 | 2.5 | 3 | — | — | — | — | — | 1900 | 4 | 10 |
| Comp. Ex. 4-3 | 3 | 1.3 | 1 | 1 | 1.5 | — | — | — | — | — | 1900 | 4 | 100 |
| Ex. 5-1 | 1.5 | 1.0 | 2 | 3 | — | 0.3 | 0.1 | 1550 | 1 | 1.5 | 1900 | 20 | 10 |
| Ex. 5-2 | 1 | 0.8 | 2 | 3 | — | 0.3 | 0.1 | 1550 | 1 | 1.5 | 1900 | 20 | 10 |
| Ex. 5-3 | 85 | 0.8 | 3 | 5 | — | — | — | 1400 | 6 | 1.5 | 1950 | 10 | 10 |

TABLE 2

| | Characteristics of Sintered Body | | | | | | | | |
|---|---|---|---|---|---|---|---|---|---|
| | Thermal Conductivity | Electric Resistivity | | Relative Density | Number of Grain Boundaries | Silicon Nitride | | Room Temp. Strength | Fracture Toughness |
| | | 125° C. | 400° C. | | | β-ratio | Al Qt. | | |
| Unit | W/mK | Ω cm | Ω cm | % | per 10 μm | % | % | MPa | MPam$^{1/2}$ |
| Comp. Ex. 3-1 | 79.4 | 3.2E+08 | 9.2E+05 | >99 | 9 | 95 | <0.1 | 700 | 6.9 |
| Comp. Ex. 3-2 | 65.8 | 6.7E+12 | 3.9E+10 | >99 | 18 | 100 | <0.1 | 820 | 7.1 |
| Ex. 3-1 | 60.7 | 8.1E+14 | 1.2E+13 | >99 | 26 | 100 | <0.1 | 720 | 6.7 |
| Ex. 3-2 | 61.2 | 1.1E+14 | 3.8E+13 | >99 | 23 | 100 | <0.1 | 690 | 6.3 |

TABLE 2-continued

| | Characteristics of Sintered Body | | | | | | | | |
|---|---|---|---|---|---|---|---|---|---|
| | Thermal | Electric Resistivity | | Relative | Number of Grain | Silicon Nitride | | Room Temp. | Fracture |
| Unit | Conductivity W/mK | 125° C. Ω cm | 400° C. Ω cm | Density % | Boundaries per 10 μm | β-ratio % | Al Qt. % | Strength MPa | Toughness MPam$^{1/2}$ |
| Ex. 3-3 | 60.3 | 9.8E+14 | 9.6E+12 | >99 | 21 | 100 | <0.1 | 690 | 6.9 |
| Ex. 4-1 | 87.1 | 2.8E+13 | 1.6E+12 | >99 | 14 | 100 | <0.1 | 740 | 7.1 |
| Ex. 4-2 | 99.4 | 1.6E+13 | 2.3E+11 | >99 | 11 | 100 | <0.1 | 860 | 8.6 |
| Ex. 4-3 | 96.6 | 1.2E+13 | 3.1E+11 | >99 | 9 | 100 | <0.1 | 840 | 8.3 |
| Comp. Ex. 4-1 | 119.4 | 2.3E+12 | 6.4E+08 | >99 | 5 | 100 | <0.1 | 840 | 9.1 |
| Comp. Ex. 4-2 | 99.7 | 9.8E+11 | 9.3E+08 | >99 | 7 | 100 | <0.1 | 800 | 9.0 |
| Comp. Ex. 4-3 | 130.1 | 1.6E+12 | 3.8E+08 | >99 | 5 | 100 | <0.1 | 830 | 8.9 |
| Ex. 5-1 | 92.4 | 7.9E+13 | 5.7E+12 | >99 | 14 | 100 | <0.1 | 810 | 7.2 |
| Ex. 5-2 | 102.1 | 9.1E+13 | 9.1E+12 | 98 | 12 | 100 | <0.1 | 780 | 6.8 |
| Ex. 5-3 | 91.9 | 1.8E+13 | 4.1E+11 | 97 | 16 | 100 | 0.2 | 770 | 7.2 |

Results

As shown in Examples 3-1 to 3-3, the sintered bodies having preferable thermal conductivity and electrical resistivity were obtained as long as the Mg was contained within the range of the present invention. On the contrary, as shown in Comparative Examples 3-1 and 3-2, the sintered bodies having no Mg had low electrical resistivity.

Figure 3:
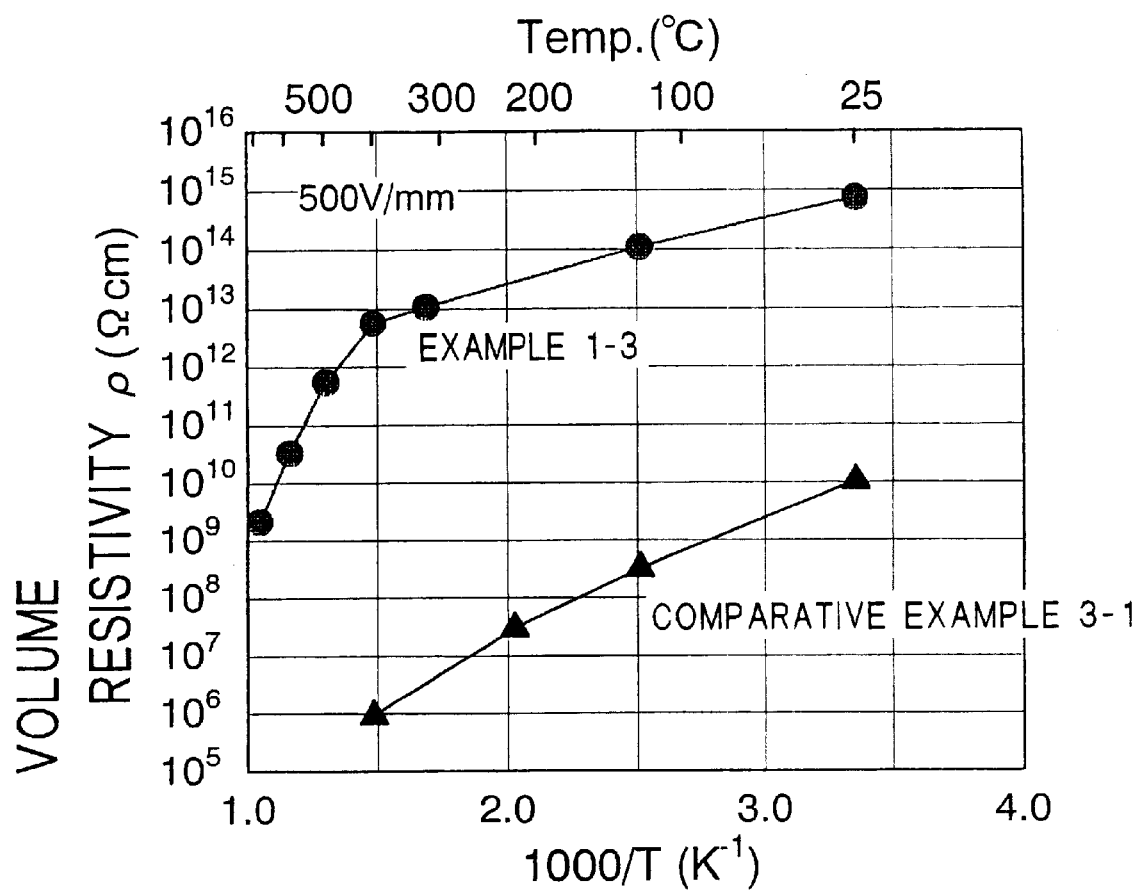
FIG. 3 is a graph, showing a correlation between the electrical resistivity and the temperature of sintered bodies.

FIG. 3 is a graph, showing the correlation between the electrical resistivity and the temperature of the sintered body of Example 1-3 containing Mg within the range of the present invention and of the sintered body containing no Mg of the Comparative Example 3-1. As clearly shown in FIG. 3, the sintered body containing the Mg of Example 1-3 showed high electrical resistivity from an ordinary temperature up to a high temperature range around 400° C.

EXAMPLE 4

Figure 2:
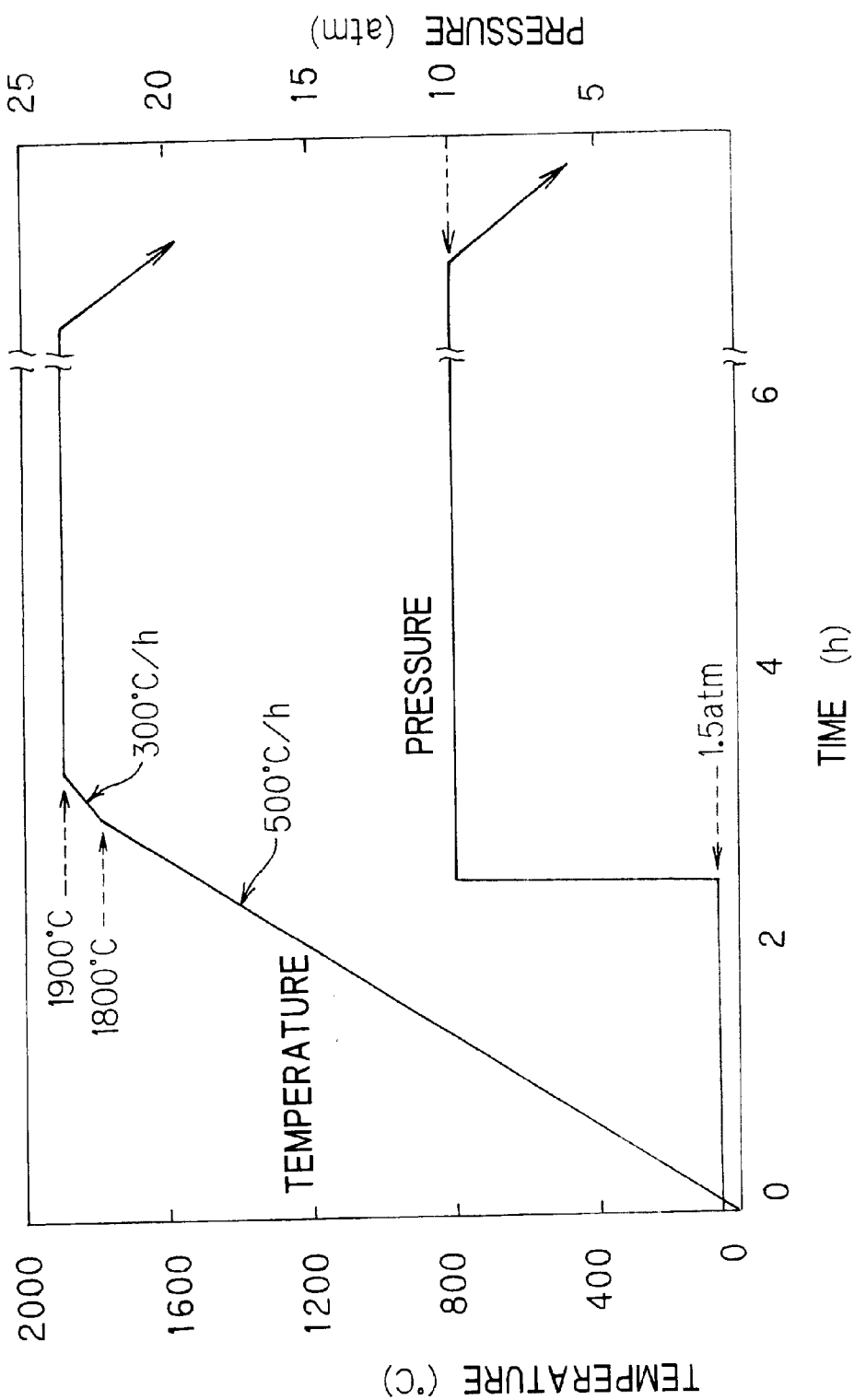
FIG. 2 is a graph, showing a sintering schedule according to Comparative Example 4-1.

In Example 4, the effects of the temperature holding step were tested. The sintered bodies were produced as in Example 1 under the conditions mentioned in Table 3, thus obtaining the sintered bodies of Examples 4-1 to 4-3. However, for Comparative Examples 4-1 to 4-3, sintering was carried out in accordance with the temperature rising schedule shown in FIG. 2.

Specifically, without a temperature holding step in the temperature rising process, the pressure of $N_2$ gas simply changed from 1.5 atm to 10 atm or 100 atm at 1500° C. The composition of the materials and the production conditions, and the characteristics of the sintered bodies are shown in Table 3 and Table 4, respectively.

Moreover, in addition to $Y_2O_3$, $Yb_2O_3$ in Example 4-3 and $Nd_2O_3$ in Example 4-2 and Comparative Examples 4-1 to 4-3 were used as a rare earth oxide.

Results

As shown in Examples 4-1 to 4-3, when the temperature holding step was properly carried out, sintered bodies having preferable thermal conductivity and electric resistivity were obtained. On the contrary, as the temperature holding step in the temperature rising process was not carried out as shown in Comparative Examples 4-1 to 4-3, the electrical resistivity of the sintered bodies declined.

EXAMPLE 5

Example 5 tested the effects due to the kinds of silicon nitride powders in the raw material powder. The sintered bodies were produced as in Example 1 under the conditions mentioned in Table 3, thus obtaining the sintered bodies of Examples 5-1 to 5-3.

However, in Example 5-1, a commercial silicon nitride powder having 5.5 m$^2$/g in specific surface area was used. A commercial silicon nitride powder having 3.4 m$^2$/g in specific surface area was used in Example 5-2 while a commercial silicon nitride powder having 11.2 m$^2$/g in specific surface area was used in Example 5-3.

The composition of the materials and the production conditions, and the characteristics of the sintered bodies are shown in Table 3 and Table 4, respectively. Moreover, in Examples 5-1 and 5-2, $Mo_2C$ was added as a light light shielding agent at 0.1 wt. % relative to the molding materials.

Results

As shown in Examples 5-1 to 5-3, even if the kinds of silicon nitride powder were changed, high thermal conductivity and electrical resistivity were obtained as long as the amount of a Mg compound, the conditions of holding a constant temperature and sintering conditions were within the range of the present invention.

EXAMPLE 6

The powders having the same compositions as in Example 1-3 and Comparative Examples 3-1 and 4-1 were molded in a metal mold at 150 MPa, thus providing compacts of 50×60×1 mm. The compacts were sintered under the same conditions as in Example 1-3 and Comparative Examples 3-1 and 4-1, and were finally ground, thus providing plate-form sintering bodies of 40×50×0.6 mm.

Commercial Ag—Cu—Ti braze paste was screen-printed on both surfaces of the sintered bodies, except for the 5 mm wide periphery. With a 0.3 mm thick copper plate being fixed onto both surfaces, heat treatment was carried out for ten minutes at 850° C. under a vacuum, thereby providing composite joint bodies of silicon nitride/copper. Subsequently, a resist was printed on one surface of the composite joint bodies so as to form a circuit. After curing, the resist was etched with a ferric chloride solution, thus forming circuit patterns.

Furthermore, the residual braze between the circuit patterns was removed by washing it with an acid ammonium fluoride solution and then with water several times, thereby making circuit substrates. (Each substrate is mentioned as a circuit substrate of Example 6-1 and Comparative Examples 6-1 and 6-2, respectively.)

600 V was applied between the front surface and the back surface of the three kinds of circuit substrates. While sufficient electrical insulation was obtained for the circuit substrate of Example 6-1 at 200 GΩ, insufficient insulation was obtained at 30 MΩ and 1 GΩ for the circuit substrates of Comparative Examples 6-1 and 6-2, respectively. Specifically, although the insulation of the circuit substrates of Comparative Examples 6-1 and 6-2 was not broken, sufficient electrical insulation properties were not obtained and the substrates were not appropriate as a circuit substrate for semiconductor device for controlling large current.

As explained above, the silicon nitride sintered body of the present invention has high thermal conductivity and excellent electrical insulation properties at high temperature, so that it may be preferably used as, e.g., an on-vehicle circuit substrate, particularly as a circuit substrate for a semiconductor device, such as a thyristor, which controls a large current.

What is claimed is:

1. A silicon nitride sintered body, comprising silicon nitride crystalline grains and a grain boundary phase, and containing Mg in an amount of 0.3 to 10 wt. % in terms of an oxide; wherein said sintered body has a thermal conductivity of 60 W/mK or more and an electrical resistivity of 1E+13 Ωcm or higher at 125° C.

2. The silicon nitride sintered body according to claim 1, having an electrical resistivity of 1E+11 Ωcm or more at 400° C.

3. The silicon nitride sintered body according to claim 1, further comprising Al in an amount of 0.25 wt. % or less.

4. A circuit substrate, comprising a silicon nitride sintered body comprising silicon nitride crystalline grains and a grain boundary phase, and containing Mg in an amount of 0.3 to 10 wt. % in terms of an oxide; wherein said sintered body has a thermal conductivity of 60 W/mK or more and an electrical resistivity of 1E+13 Ωcm or higher at 125° C.

5. The circuit substrate according to claim 4, having an electrical resistivity of 1E+11 Ωcm or more at 400° C.

6. The circuit substrate according to claim 4, further comprising Al in an amount of 0.25 wt % or less.

7. A method of producing a silicon nitride sintered body comprising the steps of:
   forming a compact of a molding material comprising silicon nitride powder, a Mg compound and a sintering aid, said Mg compound being present in an amount 0.3 to 10 wt. % in terms of an oxide;
   holding said compact at a substantially constant holding temperature in a range of 1400° C. to 1700° C. for at least 0.5 hours; and
   increasing said holding temperature to a sintering temperature in a range of 1900° C. to 2000° C., and sintering said compact under a nitrogen atmosphere.

* * * * *